United States Patent
Fujihara et al.

(10) Patent No.: US 7,232,608 B2
(45) Date of Patent: Jun. 19, 2007

(54) CONDUCTIVE MATERIAL AND MANUFACTURING METHOD THEREOF

(75) Inventors: Masahito Fujihara, Yamanashi-ken (JP); Masahiro Kouno, Yamanashi-ken (JP); Kazuya Edamura, Tokyo (JP)

(73) Assignees: NISCA Corporation, Yamanashi-ken (JP); New Technology Management Co., Ltd., Katsushiki-ku (JP)

( * ) Notice: Subject to any disclaimer, the term of this patent is extended or adjusted under 35 U.S.C. 154(b) by 47 days.

(21) Appl. No.: 11/122,138

(22) Filed: May 4, 2005

(65) Prior Publication Data
US 2005/0255312 A1    Nov. 17, 2005

(30) Foreign Application Priority Data
May 13, 2004 (JP) ............................. 2004-143349

(51) Int. Cl.
*B32B 9/00* (2006.01)
(52) U.S. Cl. ..................................... 428/408
(58) Field of Classification Search ................ 428/408; 29/602.1, 600; 264/284
See application file for complete search history.

(56) References Cited

U.S. PATENT DOCUMENTS 7,051,429 B2 * 5/2006 Kerr et al. ..................... 29/825

FOREIGN PATENT DOCUMENTS

| JP | 07-147508 A | 6/1995 |
|----|-------------|--------|
| WO | WO 99/67754 A1 | 12/1999 |
| WO | WO 00/16286 A1 | 3/2000 |
| WO | WO 01/59880 A1 | 8/2001 |

* cited by examiner

*Primary Examiner*—Jennifer McNeil
*Assistant Examiner*—Daniel Miller
(74) *Attorney, Agent, or Firm*—Christensen O'Connor Johnson Kindness PLLC (57) ABSTRACT

The present invention provides a conductive material having superior bending property and superior bending resistant property and a method for manufacturing the same. This object is achieved by a conductive material comprising a substrate and a conductive portion formed within the substrate, wherein a change ratio in the electric resistance values before and after a bending resistant property test, in which the conductive portion is bent by 180 degrees and a load of 1 kg/cm² is imposed on the bent portion for one hour, is set within a range of ±10%.

12 Claims, 2 Drawing Sheets

CONDUCTIVE MATERIAL AND MANUFACTURING METHOD THEREOF

FIELD OF THE INVENTION

The present invention relates to a conductive material and a manufacturing method thereof. In particular, the present invention relates to a material for use of electric parts or a material for use of electronic circuits, that is, more specifically, a conductive material for use as an antenna element, and a method for manufacturing the same. Moreover, the present invention also relates to a conductive material having a superior bending resistant property and a method for manufacturing such a material.

BACKGROUND OF THE INVENTION

Recently, radio frequency identification tags (hereinafter, may be referred to simply as "RFID tag") and systems using such tags have been intensively studied and developed. The RFID tag has been expected to be used in various systems. For example, the application of such a tag to a security system that carries out an authentication process for people to come in or go out has been proposed. In this case, the authentication process is carried out by confirming the presence or absence of the RFID tag through radio data transmission.

Since the RFID tag of this type requires an antenna element, there have been demands for a technique for forming an antenna element in various substrates. For example, WO 99/67754 and WO 00/16286 have disclosed devices using the RFID tag of this type and methods relating to the devices, in which an antenna element is formed on a substrate. For example, WO 99/67754 discloses a method in which a conductor is joined to a substrate to form an antenna element. Moreover, WO 00/16286 discloses a method in which a conductor is formed on a substrate to form an antenna element, with the adhesion between the antenna element and the substrate being enhanced by using an adhesive and the like.

However, the conductors (antenna element) formed on substrates, disclosed in WO 99/67754 and WO 00/16286, have an inferior bending property. Thus, the conductors have some problems such that the conductor is disconnected, when the conductive portion is bent by 180 degrees, or when the bending process is repeated several times.

With respect to a conductor material having a good bending property, for example, conductive polymers and shape-memory alloys are proposed. For example, WO 01/59880A1 has disclosed a conductive polymer. It has been proposed that an antenna element is formed by using such a conductive polymer as a conductive material. Moreover, Japanese Patent Application Laid-Open (JP-A) No. 7-147508 has disclosed a shape-memory alloy and proposed that an antenna element can be formed by using the shape-memory alloy as the conductive material in a manner similar to the conductive polymer. However, even if the conductive polymer or the shape-memory alloy having a bending property is used, it is not possible to obtain sufficient durability to bending by 180 degrees, at present. Moreover, the shape-memory alloys used also have a problem of high costs.

SUMMARY OF THE INVENTION

An object of the present invention is to solve the above-mentioned problems.

More specifically, an object of the present invention is to provide a conductive material that has a superior bending property as well as a superior bending resistant property, and a manufacturing method for such a conductive material. In addition to the above object, an object of the present invention is to provide a conductive material which also achieves low costs, together with the superior bending property and bending resistant property, and a manufacturing method for such a conductive material.

As a result of extensive investigations to attain the above-described object, the present inventors have found that it becomes possible to provide a conductive material that has a superior bending property as well as a superior bending resistant property by integrally forming a conductive portion with the substrate. More specifically, the present inventors have proposed the following invention.

A conductive material comprising: a substrate; and a conductive portion formed within the substrate, wherein a change ratio in the electric resistance values before and after a bending resistant property test, in which the conductive portion is bent by 180 degrees and a load of 1 kg/cm$^2$ is imposed on the bent portion for one hour, is set within a range of ±10%, preferably within a range of ±6.0%, more preferably within a range of ±1.0%.

In the above material, at least one surface of the conductive portion may be formed within the same plane as the surface of the substrate, and the one surface of the conductive portion to be formed within the same plane as the surface of the substrate may be allowed to have a predetermined area.

A conductive material comprising: a substrate; and a conductive portion formed within the substrate, wherein at least one surface of the conductive portion is formed within the same plane as the surface of the substrate, and the one surface of the conductive portion to be formed within the same plane as the surface of the substrate is allowed to have a predetermined area.

In the above material, a change ratio in the electric resistance values before and after a bending resistant property test, in which the conductive portion is bent by 180 degrees and a load of 1 kg/cm$^2$ is imposed on the bent portion for one hour, may be set within a range of ±10%, preferably within a range of ±6.0%, more preferably within a range of ±1.0%.

In any one of the above materials, a conductor which forms the conductive portion may be at least one selected from the group consisting of carbon black, carbon nanotubes, carbon nanofibers, graphite, metal particles, and conductive composite particles having a surface layer coated with metal.

In any one of the above materials, the shape of the conductor forming the conductive portion may be at least one selected from the group consisting of a powder shape, a fine powder shape, a lump shape, a whisker shape, a flat shape, and a fiber shape.

In any one of the above materials, the substrate may be a porous structural body.

In any one of the above materials, the substrate may be a porous structural body, and the conductive portion may be formed so that conductor particles are attached with the porous structural body of the substrate.

In any one of the above materials, the substrate may be a porous structural body, a solution containing conductor particles may be impregnated into the porous structural body, and the conductive portion may be formed so that conductor particles are bonded to the porous structural body of the substrate.

In any one of the above materials, the substrate may have a water-absorbing rate of 50% or more.

In any one of the above materials, the substrate may have a water-absorbing rate of 80% or more.

In any one of the above materials, the substrate may contain at least one or more of materials selected from the group consisting of polyurethane, paper, cloth, non-woven fabrics, and porous plastics.

In any one of the above materials, the conductive portion may have an electric resistance value of 50 kΩ or less as a converted value with a size of 50 mm×5 mm.

In any one of the above materials, the conductive portion may have an electric resistance value of 5 kΩ or less as a converted value with a size of 50 mm×5 mm.

In any one of the above materials, the conductive material may be a material for use of an electric part or a material for use of an electronic circuit. Examples of the electric parts or the electronic circuits may include a conductive wiring, antenna, and the like.

In any one of the above materials, the conductive portion may be used as an antenna element.

A method for manufacturing a conductive material comprising a substrate and a conductive portion formed within the substrate, comprising the steps of:

applying a conductor dispersion containing a conductor to the substrate, to impregnate the conductor dispersion into the substrate;

removing the conductor dispersion remained on the surface of the substrate; and drying the substrate impregnated with the conductor dispersion, to form the portion impregnated as the conductive portion.

The step of applying and impregnating of the above method may further comprise a step of placing a mask with a hole having a desired shape on a surface opposing to the surface of the substrate to which the conductor dispersion is applied, and impregnating the conductor dispersion into the substrate under a gas flow from the applied surface side toward the mask side, to form the conductive portion with both bases each having a desired shape.

In any one of the above methods, at a shear rate of 2.0/s, the viscosity of the conductor dispersion may range from 0.05 to 140.0 Pa·s, and at a shear rate of 50.0/s, the viscosity may range from 0.05 to 11.0 Pa·s.

In any one of the above methods, at a shear rate of 2.0/s, the viscosity of the conductor dispersion may range from 0.05 to 10.0 Pa·s, and at a shear rate of 50.0/s, the viscosity may range from 0.05 to 5.0 Pa·s.

In any one of the above methods, the viscosity of the conductor dispersion may satisfy the following expression 1:

(Viscosity value at a shear rate of 2.0/s)≧1.1×(Viscosity value at a shear rate of 50.0/s)　　　Expression 1.

In any one of the above methods, the conductor dispersion has an aqueous dispersant.

In any one of the above methods, the conductor dispersion is free from a binder.

In any one of the above methods, a change ratio in the electric resistance values before and after a bending resistant property test, in which the conductive portion is bent by 180 degrees and a load of 1 kg/cm$^2$ is imposed on the bent portion for one hour, may be set within a range of ±10%, preferably within a range of ±6.0%, more preferably within a range of ±1.0%.

In any one of the above methods, at least one surface of the conductive portion may be formed within the same plane as the surface of the substrate, and the one surface of the conductive portion to be formed within the same plane as the surface of the substrate may be allowed to have a predetermined area.

In any one of the above methods, the conductor dispersion may comprise at least one conductor selected from the group consisting of carbon black, carbon nanotubes, carbon nanofibers, graphite, metal particles, and conductive composite particles having a surface layer coated with metal; and the conductor may form the conductive portion.

In any one of the above methods, the conductor dispersion may comprise the conductor having at least one shape selected from the group consisting of a powder shape, a fine powder shape, a lump shape, a whisker shape, a flat shape, and a fiber shape; and the conductor may form the conductive portion.

In any one of the above methods, the substrate may be a porous structural body.

In any one of the above methods, the substrate may have a water-absorbing rate of 50% or more.

In any one of the above methods, the substrate may have a water-absorbing rate of 80% or more.

In any one of the above methods, the substrate may contain at least one or more of materials selected from the group consisting of polyurethane, paper, cloth, non-woven fabrics, and porous plastics.

In any one of the above methods, the conductive portion may have an electric resistance value of 50 kΩ or less as a converted value with a size of 50 mm×5 mm.

In any one of the above methods, the conductive portion may have an electric resistance value of 5 kΩ or less as a converted value with a size of 50 mm×5 mm.

In any one of the above methods, the conductive material may be a material for use of an electric part or a material for use of an electronic circuit.

In any one of the above methods, the conductive portion may be used as an antenna element.

A conductive material obtained by any one of the above methods.

A conductor dispersion for use of applying to a water-absorbing substrate, impregnating, drying and forming a conductive portion on the substrate, wherein at a shear rate of 2.0/s, the viscosity of the conductor dispersion may range from 0.05 to 140.0 Pa·s, and at a shear rate of 50.0/s, the viscosity may range from 0.05 to 11.0 Pa·s.

In the above conductor dispersion, at a shear rate of 2.0/s, the viscosity of the conductor dispersion may range from 0.05 to 10.0 Pa·s, and at a shear rate of 50.0/s, the viscosity may range from 0.05 to 5.0 Pa·s.

In any one of the above conductor dispersions, the viscosity of the conductor dispersion may satisfy the following expression 1:

(Viscosity value at a shear rate of 2.0/s)≧1.1×(Viscosity value at a shear rate of 50.0/s)　　　Expression 1.

In any one of the above conductor dispersion, the conductor dispersion has an aqueous dispersant.

In any one of the above conductor dispersions, the conductor dispersion is free from a binder.

In any one of the above conductor dispersions, the conductor dispersion may comprise at least one conductor selected from the group consisting of carbon black, carbon nanotubes, carbon nanofibers, graphite, metal particles, and conductive composite particles having a surface layer coated with metal; and the conductor may form the conductive portion.

In any one of the above conductor dispersions, the conductor dispersion may comprise the conductor having at least one shape selected from the group consisting of a powder shape, a fine powder shape, a lump shape, a whisker shape, a flat shape, and a fiber shape; and the conductor may form the conductive portion.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Hereinafter, the present invention will be described in detail.

The present invention provides a conductive material comprising a substrate and a conductive portion to be formed within the substrate.

The material of the present invention is designed so that a change ratio in the electric resistance values before and after a bending resistant property test, in which the conductive portion is bent by 180 degrees and a load of 1 kg/cm$^2$ is imposed on the bent portion for one hour may be set within a range of ±10%, preferably within a range of ±6.0%, more preferably within a range of ±1.0%. When the a change ratio is within this range, it becomes possible to ensure the reliability of the conductive portion, that is, the normal operation of an electronic circuit connected through the conductive portion.

The bending resistant property test of the present invention is more severe than the testing method of the bending resistant property (circular mandrel method) according to JIS K5600-5-1. In the bending resistant property test of the present invention, the diameter of the mandrel to be used under JIS K5600-5-1 is set to 0 mm, with a load of 1 kg/cm$^2$ being imposed on the bent portion in the bent state for one hour. Since the change ratio in the electric resistance values before and after the test ranges within ±10%, the material of the present invention has a superior bending property or superior bending resistant property.

Moreover, in the material of the present invention, at least one surface of the conductive portion is formed within the same plane as the surface of the substrate, and the one surface of the conductive portion to be formed within the same plane as the surface of the substrate is allowed to have a predetermined area. Thus, since the conductive portion is integrally formed with the substrate, the material is allowed to have properties similar to the substrate, e.g., flexibility and bending resistant property similar to the substrate.

Figure 1:
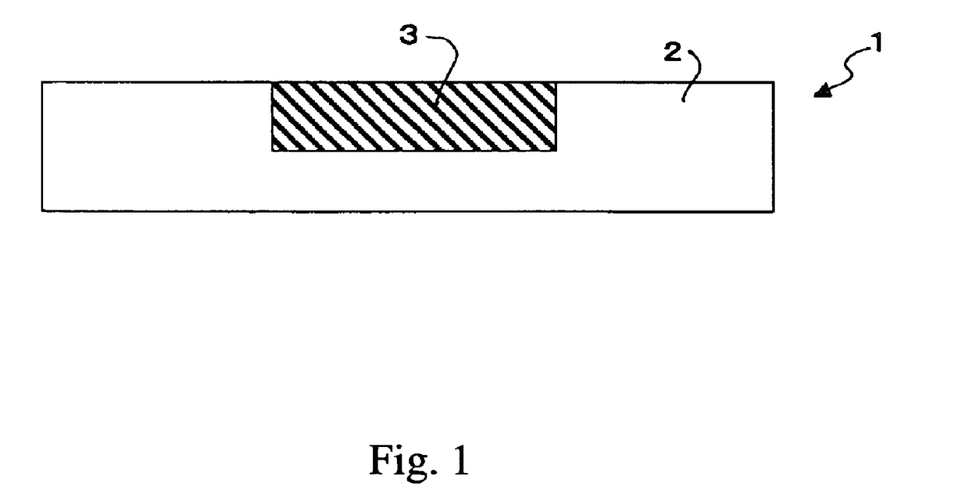
FIG. 1 is a drawing that schematically shows a cross section of a conductive material in accordance with the present invention.

FIG. 1 is a drawing that schematically shows a cross section of a material 1 of the present invention. This material 1 has a structure in which a conductive portion 3 is formed within a substrate 2. One surface of the conductive portion 3 is formed within the same plane as the surface of the substrate 2.

In the material of the present invention, the conductive portion may be made from the following conductor. In other words, the conductor may be made to have properties similar to the substrate, that is, flexibility and bending resistant property similar to the substrate, when the conductor is formed on the substrate to become the conductive portion. Examples of the conductor of this type may include, but are not limited to, carbon black, carbon nanotubes, carbon nanofibers, graphite, metal particles and conductive composite particles having a surface layer coated with metal. Furthermore, metal particles also include metal nanoparticles, and conductive composite particles also include conductive nanoparticles.

The shape of the conductor is not particularly limited, as long as it has the above-mentioned properties. For example, the shape of the conductor may include, but are not limited to, a powder shape, a fine powder shape, a lump shape, a whisker shape, a flat shape and a fiber shape.

With respect to the material of the present invention, the substrate may be designed so as to be integrally formed with the conductor. In this regard, the substrate may be prepared as a porous structural body.

The substrate may have a water-absorbing rate of 50% or more, preferably 80% or more. With this arrangement, the substrate is allowed to absorb a conductor dispersion having a conductor so that the conductor is formed into an integral part of the substrate.

In the present invention, the water-absorbing rate was determined through the following processes. A sample having a square shape (substrate) of 10 cm in each side, which had been left in a desiccator for one whole day and night to be dried, was measured in its dried weight. Thereafter, the sample was completely immersed in a container filled with tap water for 10 minutes at room temperature. In this case, the substrate was maintained in water in a sandwiched state so as not to float onto the water surface during the immersing process. After the sample had been taken out of the container, remaining water droplets on the surface were lightly wiped with filter paper, and the weight after the immersing process was measured. The water-absorbing rate was calculated based upon the following formula.

Water-absorbing rate (%)={(weight after immersion)−(dried weight)}/(dried weight)×100.

With respect to the materials of the present invention, the substrate may have the above-mentioned properties, and preferably may contain at least one or more materials selected from the group consisting of polyurethane, paper, cloth, non-woven fabrics and porous plastics.

With respect to the materials of the present invention, the conductive portion may have an electric resistance value of 50 kΩ or less, preferably 5 kΩ or less, as a converted value with a size of 500 mm×5 mm. Here, the electric resistance value is a value in a state that has not been subjected to a bending resistant property test.

The conductive material of the present invention can be manufactured through the following method. The conductive material can be manufactured by the method comprises a step of applying a conductor dispersion containing a conductor to the substrate, to impregnate the conductor dispersion into the substrate; and a step of drying the substrate impregnated with the conductor dispersion, to form the portion impregnated as the conductive portion. Furthermore, the method may further comprise a step of removing the residual conductor dispersion from the surface of the substrate. The step of removing may be carried out between the step of applying and impregnating and the step of a step of drying the substrate impregnated with the conductor dispersion, to form the portion impregnated as the conductive portion.

Hereinafter, the method will be described in detail.

At first, the step of applying and impregnating is carried out in the method of the present invention. With respect to the conductor and the substrate, the above-mentioned conductor and substrate may be used.

The conductor dispersion containing a conductor is a solution in which the conductor is dispersed. Although not particularly limited, the dispersant may be an aqueous solution containing water, and, for example, the dispersant may be prepared as only the water.

The conductor dispersion may be free from a binder component, such as a water-soluble resin or an oil-soluble resin; a photo-setting resin or a thermoset resin; and a dispersion resin like an emulsion and a colloidal dispersion. The conductor dispersion may consist of, or may consist essentially of, for example, a conductor and a dispersant.

In the present invention, the step of applying to impregnate is not particularly limited to the impregnation process through coating. Thus, various methods, techniques and processes may be used. For example, a filling process and an injection process may be used for the step of applying. Moreover, although not particularly limited, specific coating methods may include, for example, various printing methods (such as ink jet printing, stamp printing, off-set printing, intaglio printing, relief printing, pad printing, gravure printing, screen printing and the like) and various coating methods (such as spray coating, roller coating, brush coating and the like).

The viscosity of the conductor dispersion may be set in the following range. In other words, at a shear rate of 2.0/s, the viscosity may range from 0.05 to 140.0 Pa·s, preferably from 0.05 to 10.0 Pa·s, and at a shear rate of 50.0/s, the viscosity may range from 0.05 to 11.0 Pa·s, preferably from 0.05 to 5.0 Pa·s.

Moreover, the viscosity of the conductor dispersion may satisfy the following expression 1:

(Viscosity value at a shear rate of 2.0/s)≧1.1×(Viscosity value at a shear rate of 50.0/s)   Expression 1.

By allowing the conductor dispersion to have these viscosity characteristics, the impregnation of the dispersion into the substrate and the adsorption of the dispersion to the substrate can be easily carried out in various printing methods and various coating methods. The mechanism is explained as follows: In the respective printing methods and the respective coating methods, the dispersion is transported at high shear rates, and during the transporting time, the viscosity of the dispersion is preferably set to a low level so as to allow easy impregnation to the porous structural body. After the impregnation, the dispersion is kept at low shear rates so that it is adsorbed into the porous structural body that forms a substrate. In this case, the viscosity thereof is preferably set to a higher level as compared with that during the transporting time; thus, it becomes possible to prevent the dispersion from excessively dispersing in the porous structural body and consequently to make the shape of the impregnated conductive portion clearer.

Figure 2:
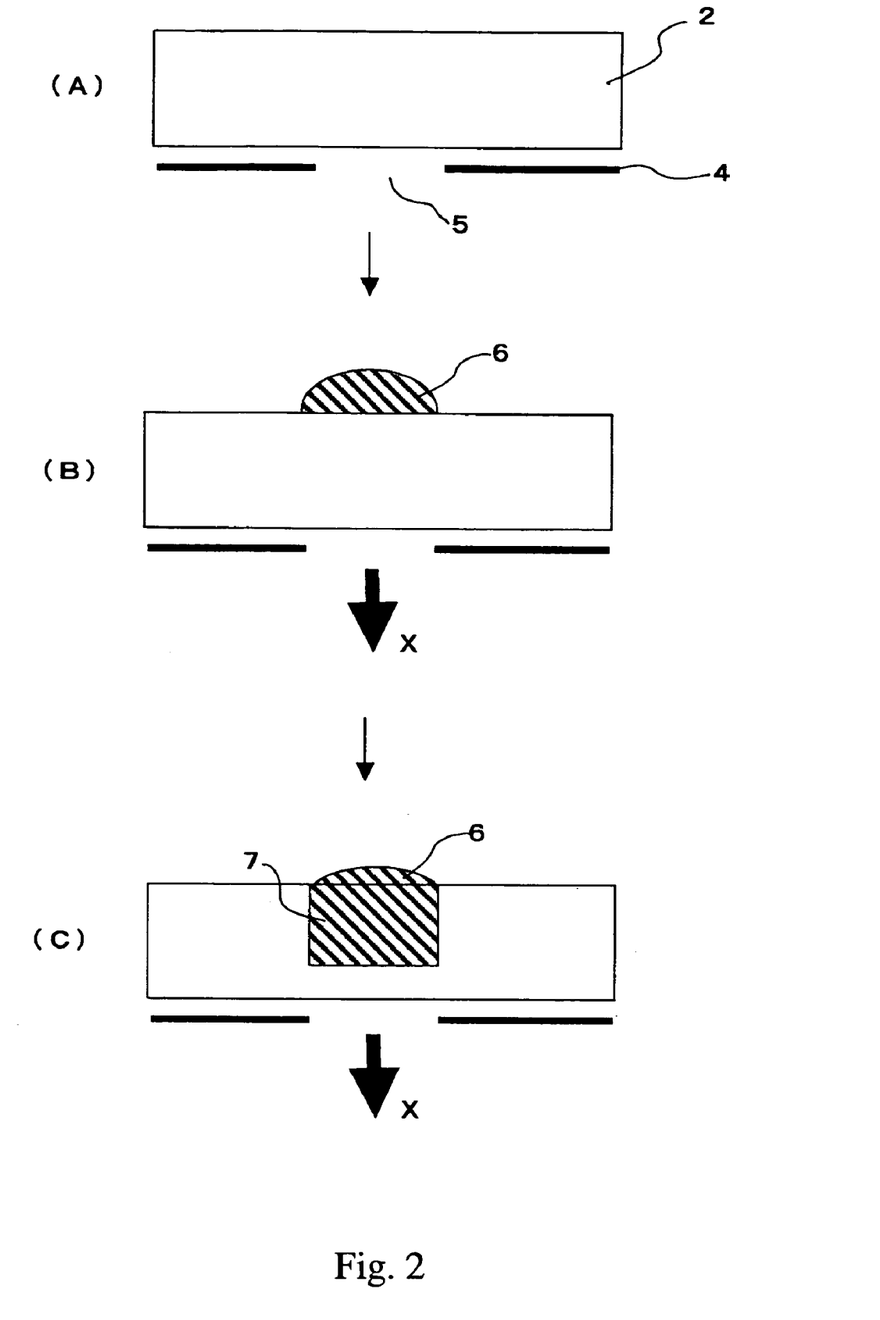
FIG. 2 is a drawing that explains a process in which a suction operation through a mask is carried out, which is one embodiment of the method of the present invention.

The method may further comprise, in the step of applying to impregnate, a step of placing a mask with a hole having a desired shape on a surface opposing to the surface of the substrate to which the conductor dispersion is applied, and impregnating the conductor dispersion into the substrate under a gas flow from the applied surface side toward the mask side, to form the conductive portion with both bases each having a desired shape. Furthermore, in order to generate the gas flow from the applied surface side toward the mask side, suction may be carried out from the mask side. FIG. 2 is a drawing that explains the suction process through the mask. In FIG. 2(A), a mask 4 with a hole 5 having a desired shape is placed on one of the surfaces of the substrate 2. In this state, the conductor dispersion 6 is applied to the substrate (see FIG. 2(B)). During the application or after the application, a suction process is carried out in the direction of X, the substrate is impregnated with the conductor dispersion 6 so that, as shown in FIG. 2(C), an impregnated area (conductive portion) 7 is formed. By having this process, both of the bases of the conductive portion are allowed to have desired shapes, thereby preventing formation of an undesired shape, such as a dispersed shape. Moreover, it becomes possible to suppress adverse effects to the characteristics of the conductive portion due to the formation of an undesired shape, that is, adverse effects to the electric resistance value or the antenna characteristics.

Next, after the step of applying to impregnate, the resulting conductive material may be subjected to a step of removing the residual conductor dispersion from the surface of the substrate. The residual dispersion maintained on the surface of the substrate tends to cause an undesired conductor on the surface in the succeeding drying process. In such a case, since the conductor is not adsorbed onto the substrate or has a low degree of adsorption, the conductor tends to be separated when the conductive material is bent or crooked. In order to prevent such an undesired phenomenon, in case where an undesired conductor is formed on the surface during the drying process, the step of removing the residual conductor dispersion may be carried out.

In the method of the present invention, the substrate impregnated with the conductor dispersion is subjected to a step of drying, to form the impregnated portion into a conductive portion. Through this step, a conductive material having a conductive portion formed on the substrate is obtained. With respect to the drying method, not particularly limited, various conventionally known processes may be used.

The above-mentioned conductive material, or the conductive material obtained by the above-mentioned method, can be applied to the field in which its characteristics, that is, the bending property and bending resistant property, are required. For example, the conductive material can be applied to materials for use of various electric parts or materials for use of various electronic circuits, such as conductive wires and antennas. In particular, with respect to the conductive material of the present invention, the conductive portion can be used as an antenna element. Therefore, the conductive material of the present invention may be used as, for example, a raw material for an RFID tag.

EXAMPLE

The present invention will be illustrated with the following examples, but the scope of the present invention is not limited by these examples.

Example 1

<Preparation of Conductor Dispersion>

Carbon black, a conductor in a fine powder state, was mixed in water together with a dispersant. The mixture was stirred and dispersed sufficiently to prepare a conductor dispersion A having a solid component of 20.5% and a conductor dispersion D having a solid component of 35.2%. To these was added and mixed carbon nanofibers, another conductor in a fine powder state (trade name: VGCF, made by Showa Denko K.K.), the amount of which is listed below.

The mixture was stirred and dispersed sufficiently to prepare conductor dispersions B, C and E to G listed in Table 1. At room temperature, each of the dispersions was measured in the viscosity (Pa·s) thereof at shear rates of 2.0 (/s) and 50.0 (/s) by using a rheometer (RS-100, made by HAAKE Co., Ltd., German company). The results thereof are also shown in Table 1. In Table 1, "CNF" represents "carbon nanofibers".

TABLE 1

| Dispersion | Solid in conductor dispersion (wt %) | Amount of CNF mixed (wt %) | Total solid (wt %) | Viscosity (Pa · s) at shear rate: 2.0 (/s) | Viscosity (Pa · s) at shear rate: 50.0 (/s) |
|---|---|---|---|---|---|
| A | 20.5 | 0 | 20.5 | 0.11 | 0.10 |
| B | 20.5 | 2.0 | 22.5 | 0.27 | 0.16 |
| C | 20.5 | 5.0 | 25.5 | 2.12 | 2.50 |
| D | 35.2 | 0 | 35.2 | 0.92 | 0.40 |
| E | 35.2 | 2.0 | 37.2 | 1.38 | 0.74 |
| F | 35.2 | 5.0 | 40.2 | 9.45 | 4.70 |
| G | 35.2 | 7.0 | 42.2 | 130 | 10.7 |

<Characteristics of Porous Substrate—Water-Absorbing Rate and Basis Weight>

The water-absorbing rate of each of substrates that are porous structural bodies was measured. The measurements on the water-absorbing rate were carried out in the following manner. A substrate, which had been left in a desiccator for one whole day and night to be dried, was cut into a square shape having 10 cm in each side, and the dried self-weight was measured. Thereafter, the sample substrate was completely immersed into a container filled with tap water at room temperature for 10 minutes, with the substrate being maintained in water in a sandwiched state so as not to float onto the water surface. After the substrate had been taken out of the container, remaining water droplets on the surface were lightly wiped with filter paper, and the weight and the amount of water-absorption were then measured; thus, the water-absorbing rate (%) to the dried self-weight was measured. The water-absorbing rate of each substrate was listed in Table 2 together with the basis weight (g/m$^2$) thereof.

TABLE 2

| Name of substrate | Material, name of manufacturer, name of product, etc. | Basis weight (g/m$^2$) | Water-absorbing rate (%) |
|---|---|---|---|
| Ruby cell | Polyurethane sheet; Toyo Polymer Co., Ltd.; Ruby cell sheet 306-W1 | 198.4 | 300.0 |
| Japanese writing paper | Calligraphy paper; Maruai Inc.; Amanogawa Japanese writing paper | 31.6 | 148.7 |
| Cooking paper | Pulp; Japan Pulp and Paper Co., Ltd.; Cooking paper | 45.9 | 120.3 |
| K-156 | Japanese paper; MOLZA Co., Ltd.; Paper mulberry k-156 | 66.1 | 116.2 |
| MO paper | Japanese paper; Echizen-washi Industrial Cooperative Society; Echizen MO paper suction | 274.3 | 104.1 |
| K-155 | Japanese paper; MOLZA Co., Ltd.; Paper mulberry k-155 | 84.2 | 88.4 |
| P paper | Paper; Fuji Xerox Office Supply Co., Ltd.; P paper | 62.4 | 73.1 |
| Cotton cloth | Cotton cloth; Meiwa Textiles Co., Ltd. | 101.1 | 63.2 |
| Super echo | Recycle paper; Rockmont Co., Ltd.; Super echo | 68.5 | 51.9 |

<Preparation of Conductive Material>

Each of conductor dispersions A to G shown in Table 1 was applied to one surface of a substrate, of which weight had been preliminarily measured, so that applied portion had a rectangular shape of 5 mm in width and 50 mm in length, to impregnate the dispersion into the substrate. In the case where, after a lapse of 10 seconds from the applying step, an excessive conductor dispersion remained on the surface of the substrate, the remaining dispersion was wiped off.

After 15 minutes at room temperature, the applied portion was dried to tough, to prepare a conductive material. The conductor dispersion was impregnated and adsorbed in the substrate. Therefore, in the conductive material, the applied portion of the conductor dispersion was allowed to form the same plane as the non-applied portion; thus, the layer, formed by the conductor dispersion, was not observed above the conductive material surface. The weight of the resulting conductive material was measured so that the amount of the conductor impregnation (mg/cm$^2$) was calculated from the applied portion of the conductor dispersion (rectangular shape with 5 mm in width and 50 mm in length) and the weight of the substrate prior to the applying step of the conductor dispersion.

Moreover, electrodes were attached to the two ends of the rectangular-shaped applied portion having 50 mm in length so that the resistance value (KΩ) of the conductive portion was measured. The amount of the impregnation of the conductor dispersion and the resistance value of the conductive portion are shown in Table 3.

TABLE 3

| Name of substrate | Conductor dispersion | A | B | C | D | E | F | G |
|---|---|---|---|---|---|---|---|---|
| I. Ruby cell | Resistance (KΩ) | 10.42 | 1.52 | 0.682 | 0.628 | 0.329 | 0.230 | 0.224 |
|  | Amount of impregnation (mg/cm$^2$) | 11.04 | 10.84 | 11.04 | 19.12 | 16.92 | 13.92 | 8.80 |
| II. Japanese writing paper | Resistance (KΩ) | 18.50 | 12.92 | 10.73 | 15.08 | 3.10 | 0.795 | 0.358 |
|  | Amount of impregnation (mg/cm$^2$) | 1.52 | 1.28 | 1.36 | 1.04 | 1.24 | 2.60 | 3.32 |
| III. Cooking paper | Resistance (KΩ) | 10.36 | 5.96 | 5.00 | 11.93 | 4.56 | 1.48 | 0.182 |
|  | Amount of impregnation (mg/cm$^2$) | 2.64 | 1.28 | 2.08 | 1.20 | 1.52 | 2.32 | 4.68 |

TABLE 3-continued

| Name of substrate | Conductor dispersion | A | B | C | D | E | F | G |
|---|---|---|---|---|---|---|---|---|
| IV. K-156 | Resistance (KΩ) | 7.08 | 3.98 | 2.48 | 7.29 | 3.24 | 3.23 | 0.393 |
| | Amount of impregnation (mg/cm$^2$) | 2.48 | 2.72 | 4.68 | 2.52 | 3.24 | 2.12 | 2.96 |
| V. MO paper | Resistance (KΩ) | 13.11 | 13.88 | 8.27 | 14.14 | 9.57 | 5.73 | 0.791 |
| | Amount of impregnation (mg/cm$^2$) | 4.00 | 1.04 | 3.32 | 0.28 | 0.24 | 0.80 | 2.96 |
| VI. K-155 | Resistance (KΩ) | 9.57 | 6.22 | 2.54 | 7.55 | 4.44 | 2.65 | 0.496 |
| | Amount of impregnation (mg/cm$^2$) | 2.44 | 1.24 | 2.84 | 1.72 | 1.68 | 1.48 | 1.88 |
| VII. P paper | Resistance (KΩ) | 112.4 | 52.1 | 31.3 | 41.3 | 13.23 | 6.76 | 0.345 |
| | Amount of impregnation (mg/cm$^2$) | 0.60 | 0.80 | 1.00 | 1.16 | 1.72 | 1.32 | 5.84 |
| VII. Cotton cloth | Resistance (KΩ) | 7.29 | 2.77 | 1.62 | 4.02 | 1.45 | 1.06 | 0.260 |
| | Amount of impregnation (mg/cm$^2$) | 2.32 | 2.44 | 3.68 | 3.72 | 4.36 | 3.56 | 5.64 |
| IX. Super echo | Resistance (KΩ) | 149.1 | 76.2 | 16.0 | 69.3 | 25.4 | 1.82 | 0.410 |
| | Amount of impregnation (mg/cm$^2$) | 0.36 | 0.32 | 0.68 | 0.56 | 0.64 | 0.52 | 3.520 |

Table 3 shows that any one of the conductive materials has a low resistance value, and serves as an effective conductive material.

<Bending Resistant Property Test>

Among the conductive materials shown in Table 3, a material (hereinafter, referred to simply as "conductive material IX-C") in which "IX. Super echo" was used as the substrate, with C being used as the conductor dispersion, and a material (hereinafter, referred to simply as "IX-F") in which "IX. Super echo" was used as the substrate, with F being used as the conductor dispersion, were subjected to a bending resistant property test.

In the bending resistant property test, an "inside bending and then leveling" conductivity measuring test, an "outside bending" conductivity measuring test, and an "outside bending and then leveling" conductivity measuring test were carried out. The "inside bending and then leveling" conductivity measuring test was as follows: After the conductive material had been bent with the applied portion of the conductor dispersion (hereinafter, referred to simply as "conductive portion") being located on the inside thereof, the conductivity was measured with the material being returned to the original state. The "outside bending" conductivity measuring test was as follows: The conductivity was measured in a state where the conductive material was bent with the conductive portion being located on the outside thereof. The "outside bending and then leveling" conductivity measuring test was as follows: After the conductive material had been bent with the applied portion of the conductor dispersion being located on the outside thereof, the conductivity was measured with the material being returned to the original state. More specifically, the following processes were carried out.

A conductor material was bent with a conductive portion of 50 mm in length being located on the inside (or outside) thereof so that the two ends in the length direction of the conductive portion were overlapped one on the other. A load was imposed on this so that the bent portion had the resulting load of 1 kg/cm$^2$, and this was left at room temperature for one hour. In the "outside bending" conductivity measuring test, after this had been left for one hour, the resistance value between the two ends of the conductive portion was measured in the same manner as described above in this bent state. Moreover, in the "inside bending and then leveling" conductivity measuring test or the "outside bending and then leveling" conductivity measuring test, after this had been left for one hour, the load was removed so that the bent portion was leveled, and the resistance value between the two ends of the conductive portion was measured in the same manner as described above.

Resistance values and its change ratio before and after the bending resistant property tests are shown in Table 4.

TABLE 4

| | IX-C | | IX-F | | Comparative example 1 | |
|---|---|---|---|---|---|---|
| Conductive material | Resistance (KΩ) | Change ratio (%) | Resistance (KΩ) | Change ratio (%) | Resistance (KΩ) | Change ratio (%) |
| Prior to bending | 16.0 | — | 1.82 | — | 0.026 | — |
| Inside bending and then leveling | 16.7 | 4.4 | 1.81 | −0.5 | >2,000 | >7.7 × 10$^6$ |
| Outside bending | 16.5 | 3.1 | 1.82 | 0 | >2,000 | >7.7 × 10$^6$ |

TABLE 4-continued

| | IX-C | | IX-F | | Comparative example 1 | |
|---|---|---|---|---|---|---|
| Conductive material | Resistance (KΩ) | Change ratio (%) | Resistance (KΩ) | Change ratio (%) | Resistance (KΩ) | Change ratio (%) |
| Outside bending and then leveling | 16.9 | 5.6 | 1.82 | 0 | >2,000 | >7.7 × 10$^6$ |

Comparative Example 1

The processes of Example 1 were carried out except that "IX. Super echo" was used as the substrate, with "DORTITE D-500", a conductive silver paste paint made by Fujikurakasei Co., Ltd., being used as the conductor dispersion and that the wiping process of the excessive dispersion from the substrate surface was not carried out after the step of applying of the conductor dispersion, to prepare a conductive material. Furthermore, since the conductive material had not been dried to touch even after a lapse of 15 minutes, the conductive material was left one whole day and night at room temperature to confirm that it was dried to touch.

Thereafter, the conductive material was subjected to the bending resistant property test in the same manner as Example 1. The results of the test are shown in Table 4.

When, after the bending test, the bent portion was enlarged and observed, it was found that a solidified silver paste had a crack along the bent portion to cause a disconnected state as the conductive portion. This was also clearly indicated by the results of the test, and any of the conductive materials of Comparative Example 1 had resistance values exceeding 2000 kΩ after the bending test, with the change ratio exceeding 7.7×10$^6$%. In contrast, the conductive materials IX-C and IX-F of the present invention had no change in the resistance values before and after the bending test to ensure proper bending resistant property thereof.

Comparative Example 2

The processes of Example 1 were carried out except that each of substrates as shown in Table 5 was used as the substrate, and each of conductor dispersions A to G was applied to the substrate to impregnate. Furthermore, in any one of the substrates, when, 10 seconds after each of conductor dispersions A to G had been applied thereto, the excessive dispersant solution was wiped off the substrate surface, the color of the applied portion showed not the black color of the dispersion, but the color of the substrate. With respect to the materials obtained in this Comparative Example, the amount of the impregnation of the conductor dispersion and the resistance value of the conductive portion were measured. The results thereof are shown in Table 6.

TABLE 5

| Substrate | Material, name of manufacturer, name of product, etc. | Basis weight (g/m$^2$) | Water-absorbing rate (%) |
|---|---|---|---|
| Electronic printed circuit board | Glass epoxy multi-layer material; Hitachi Chemical Co., Ltd.; MCL-E-67 | 2,806.0 | 0 |
| Acrylic resin plate | Acrylic sheet; Sumitomo Chemical Co., Ltd.; Sumipex E | 3,660.6 | 0 |
| Poly-propylene | Polypropylene sheet; Commercial product | 374.8 | 0 |

TABLE 6

| Name of substrate | Conductor dispersion | A | B | C | D | E | F | G |
|---|---|---|---|---|---|---|---|---|
| Electronic printed circuit board | Resistance (KΩ) | >2000 | >2000 | >2000 | >2000 | >2000 | >2000 | >2000 |
| | Amount of impregnation (mg/cm$^2$) | 0 | 0 | 0 | 0 | 0 | 0 | 0 |
| Acrylic resin plate | Resistance (KΩ) | >2000 | >2000 | >2000 | >2000 | >2000 | >2000 | >2000 |
| | Amount of impregnation (mg/cm$^2$) | 0 | 0 | 0 | 0 | 0 | 0 | 0 |
| Poly-propylene | Resistance (KΩ) | >2000 | >2000 | >2000 | >2000 | >2000 | >2000 | >2000 |
| | Amount of impregnation (mg/cm$^2$) | 0 | 0 | 0 | 0 | 0 | 0 | 0 |

In Table 6, ">2000" represents that the resistance value exceeds 2000 kΩ that is the the measuring limit of the electric resistance measuring device, making the measurement impossible. Tables 5 and 6 show that each of the materials that use substrates having a water-absorbing rate of 0% fails to provide sufficient conductivity to the applied portion.

While the preferred embodiment of the invention has been illustrated and described, it will be appreciated that various changes can be made therein without departing from the spirit and scope of the invention.

The invention claimed is:

1. A conductive material comprising:
    a substrate having a water-absorbing property; and
    a conductive portion formed within the substrate by impregnating the substrate with a conductor dispersion, which forms the conductive portion,
    wherein a change ratio in the electric resistance values before and after a bending resistant property test, in which the conductive portion is bent by 180 degrees and a load of 1 kg/cm$^2$ is imposed on the bent portion for one hour, is set within a range of ±10%.

2. The material according to claim 1, wherein at least one surface of the conductive portion is formed within the same plane as the surface of the substrate, and the one surface of the conductive portion to be formed within the same plane as the surface of the substrate is allowed to have a predetermined area.

3. The material according to claim 1, wherein a conductor which forms the conductive portion is at least one selected from the group consisting of carbon black, carbon nanotubes, carbon nanofibers, graphite, metal particles, and conductive composite particles having a surface layer coated with metal.

4. The material according to claim 1, wherein the shape of the conductor forming the conductive portion is at least one selected from the group consisting of a powder shape, a fine powder shape, a lump shape, a whisker shape, a flat shape, and a fiber shape.

5. The material according to claim 1, wherein the substrate is a porous structural body.

6. The material according to claim 1, wherein the substrate has a water-absorbing rate of 50% or more.

7. The material according to claim 1, wherein the substrate has a water-absorbing rate of 80% or more.

8. The material according to claim 1, wherein the substrate contains at least one or more of materials selected from the group consisting of polyurethane, paper, cloth, non-woven fabrics, and porous plastics.

9. The material according to claim 1, wherein the conductive portion is set to have an electric resistance value of 50 kΩ or less as a converted value with a size of 50 mm×5 mm.

10. The material according to claim 1, wherein the conductive portion is set to have an electric resistance value of 5 kΩ or less as a converted value with a size of 50 mm×5 mm.

11. The material according to claim 1, wherein the conductive material is a material for use of an electric part or a material for use of an electronic circuit.

12. The material according to claim 1, wherein the conductive portion is used as an antenna element.

* * * * *